(12) United States Patent
Lee et al.

(10) Patent No.: US 12,062,525 B2
(45) Date of Patent: Aug. 13, 2024

(54) SUPPORT UNIT, AND APPARATUS FOR TREATING SUBSTRATE WITH THE SAME

(71) Applicant: PSK INC., Gyeonggi-do (KR)

(72) Inventors: Jong Chan Lee, Gyeonggi-do (KR); Ju Young Park, Gyeonggi-do (KR); Jun Young Cho, Gyeonggi-do (KR); Hyeon Gyeong Shin, Gyeonggi-do (KR)

(73) Assignee: PSK, Inc., Gyeonggi-do (KR)

( * ) Notice: Subject to any disclaimer, the term of this patent is extended or adjusted under 35 U.S.C. 154(b) by 256 days.

(21) Appl. No.: 17/679,900

(22) Filed: Feb. 24, 2022

(65) Prior Publication Data
US 2023/0145538 A1    May 11, 2023

(30) Foreign Application Priority Data

Nov. 11, 2021 (KR) .......................... 1020210154360

(51) Int. Cl.
*H01J 37/32* (2006.01)
*H01L 21/687* (2006.01)

(52) U.S. Cl.
CPC .. *H01J 37/32715* (2013.01); *H01J 37/32568* (2013.01); *H01J 37/32816* (2013.01);
(Continued)

(58) Field of Classification Search
USPC .................................................... 156/345.54
See application file for complete search history.

(56) References Cited

U.S. PATENT DOCUMENTS

| 4,908,095 A * | 3/1990 | Kagatsume ....... H01L 21/67766 156/345.47 |
| 2004/0219006 A1* | 11/2004 | Tran .................. H01L 21/68742 414/217 |

(Continued)

FOREIGN PATENT DOCUMENTS

| JP | 06079140 U | 4/1997 |
| JP | 2010153678 A | 8/2010 |

(Continued)

OTHER PUBLICATIONS

Gauthier, Michelle. ASM International. (1995). Engineered Materials Handbook®—Desk Edition—27.1.1 Dielectric Properties. (pp. 423-438). ASM International. Retrieved from https://app.knovel.com/hotlink/pdf/id:kt012I4641/engineered-materials/dielectric-properties (Year: 1995).*

(Continued)

*Primary Examiner* — Ram N Kackar
*Assistant Examiner* — Laureen Chan
(74) *Attorney, Agent, or Firm* — KDW Firm PLLC

(57) ABSTRACT

A substrate treating apparatus includes a housing, treating space and support unit to support a substrate, dielectric plate, gas supply unit, and plasma source to generate a plasma and including a top edge electrode above the edge region supported by the support unit and bottom edge electrode below the edge region supported by the support unit, which includes a support plate having an inner space and vacuum hole that communicates with the inner space and sucking the substrate on the top surface. A lift pin assembly can transfer the substrate between an outside transfer unit and the support plate. A decompression unit can apply negative pressure to the inner space. The lift pin assembly includes a base plate and through hole penetrating the base plate to provide negative pressure in a region under the base plate to a region over the base plate. Lift pins protrude from the base (Continued)

plate and support a bottom substrate surface. A driver can lift/lower the base plate within the inner space.

18 Claims, 8 Drawing Sheets

(52) U.S. Cl.
CPC ...... *H01L 21/68742* (2013.01); *H01J 2237/0206* (2013.01); *H01J 2237/20235* (2013.01); *H01J 2237/334* (2013.01)

(56) References Cited

U.S. PATENT DOCUMENTS

| | | | | |
|---|---|---|---|---|
| 2008/0179010 | A1* | 7/2008 | Bailey, III | H01L 21/3065 156/345.43 |
| 2011/0235675 | A1* | 9/2011 | Matsudo | H01L 21/67248 374/E11.001 |
| 2017/0133260 | A1* | 5/2017 | Pohl | H01L 21/68742 |
| 2017/0221750 | A1* | 8/2017 | Cotlear | H01L 21/6831 |
| 2019/0131165 | A1* | 5/2019 | Nguyen | H01L 21/68742 |
| 2019/0214290 | A1* | 7/2019 | Marcelynas | H01L 21/68742 |

FOREIGN PATENT DOCUMENTS

| | | |
|---|---|---|
| KR | 1020120077445 A | 7/2012 |
| KR | 1020140073687 A | 6/2014 |
| KR | 102008580 B1 | 8/2019 |
| KR | 102058034 B1 | 12/2019 |
| KR | 102234220 B1 | 3/2021 |
| KR | 102275757 B1 | 7/2021 |

OTHER PUBLICATIONS

Korean Search Report for Application No. 1020210154360 dated Nov. 11, 2021.
International Search Report and Written Opinion for Application No. PCT/KR2022/016641 dated Feb. 13, 2023.

* cited by examiner

SUPPORT UNIT, AND APPARATUS FOR TREATING SUBSTRATE WITH THE SAME

CROSS-REFERENCE TO RELATED APPLICATIONS

A claim for priority under 35 U.S.C. § 119 is made to Korean Patent Application No. 10-2021-0154360 filed on Nov. 11, 2021, in the Korean Intellectual Property Office, the entire contents of which are hereby incorporated by reference.

BACKGROUND

Embodiments of the inventive concept described herein relate to a support unit, and a substrate treating apparatus with the same, more specifically, an apparatus for treating a substrate using a plasma.

Plasma refers to an ionized gas state including ions, electrons, radicals, and the like. The plasma is generated by a very high temperature, strong electric fields, or radio frequency (RF) electromagnetic fields. A semiconductor device manufacturing process includes an ashing process or an etching process of removing a film on a substrate using the plasma. The ashing process or the etching process is performed by colliding or reacting ions and radical particles contained in the plasma with a film on the substrate. The process of treating the substrate using the plasma is performed in various ways.

Among substrate treating methods of treating the substrate using the plasma, a bevel etch process generates the plasma in an edge region of the substrate to remove a thin film on the edge region of the substrate. Since the thin film on the edge region of the substrate is removed by targeting the plasma, it is important that the substrate is stably supported at a process position.

In order for the substrate to be stably supported at the process position, a structural stability of a lift pin that moves the substrate up and down is essential. If the lift pin does not have a stable fastening structure, a vibration generated in the lift pin during an up/down movement of the substrate by the lift pin is transmitted to the substrate, thereby breaking an equilibrium of the substrate. In addition, even when the substrate is supported by a support unit while maintaining an equilibrium, it must be stably fixed on the support unit. When the substrate is not fixed at the support unit and its position changes, it is difficult to efficiently remove the thin film on the edge area of the substrate.

SUMMARY

Embodiments of the inventive concept provide a support unit capable of stably fixing a substrate and a substrate treating apparatus including the same.

Embodiments of the inventive concept provide a support unit capable of stably lifting/lowering a substrate and a substrate treating apparatus including the same.

Embodiments of the inventive concept provide a support unit having a high durability by minimizing a deformation by a plasma and a substrate treating apparatus including the same.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing having a treating space; a support unit configured to support a substrate and disposed within the treating space; a dielectric plate disposed over the supporting unit and opposing a top surface of the substrate supported by the support unit; a gas supply unit configured to supply a process gas to an edge region of the substrate; and a plasma source configured to generate a plasma by exciting the process gas at the edge region of the substrate, wherein the plasma source comprises: a top edge electrode disposed above the edge region of the substrate supported by the support unit; and a bottom edge electrode disposed below the edge region of the substrate supported by the support unit, the support unit comprises: a support plate having an inner space therein and having a vacuum hole on a top surface thereon, the vacuum hole being in communication with the inner space and sucking the substrate placed on the top surface of the support plate; a lift pin assembly configured to transfer the substrate between an outside transfer unit and the support plate; and a decompression unit configured to apply a negative pressure to the inner space, the lift pin assembly comprises: a base plate located in the inner space and having a through hole, the through hole penetrating the base plate to provide the negative pressure in a region under the base plate to a region over the base plate in the inner space; a plurality of lift pins upwardly protruding from the base plate and supporting a bottom surface of the substrate; and a driver configured to lift/lower the base plate within the inner space.

In an embodiment, the vacuum hole comprises a pin hole through which the lift pin moves upwardly and/or downwardly.

In an embodiment, the vacuum hole further comprises a penetration hole spaced apart from the pin hole.

In an embodiment, the inner space is formed in a shape corresponding to the base plate when seen from above.

In an embodiment, the base plate comprises: a central part connected to the driver; and a plurality of bar-shaped body parts, each body part radially extending from the central part, and wherein the lift pin and the through hole are formed at the body part.

In an embodiment, the lift pin assembly comprises: a bottom holder coupled with the base plate and fixing a bottom end of the lift pin; and a top holder engaged with a top of the bottom holder and fixing the bottom holder and the lift pin.

In an embodiment, the bottom holder and the top holder are provided as an elastic material.

In an embodiment, the bottom holder and the top holder are provided as a conductive material.

In an embodiment, the bottom holder and the top holder are provided as an electrostatic dissipation material.

In an embodiment, the bottom holder and the top holder are provided as an antistatic material.

In an embodiment, the lift pin is provided as an insulation material.

The inventive concept provides a substrate treating apparatus. The substrate treating apparatus includes a housing having a treating space; a support unit configured to support a substrate and disposed within the housing; a gas supply unit configured to supply a process gas to the treating space; and a plasma source configured to generate a plasma from the process gas, wherein the support unit comprises: a support plate having an inner buffer space therein and having a vacuum hole on a top surface thereon, the vacuum hole being in communication with the inner space and sucking the substrate placed on the top surface of the support plate; a lift pin assembly configured to transfer the substrate between an outside transfer unit and the support plate; and a decompression unit configured to apply a negative pressure to the buffer space, and the lift pin assembly comprises: a base plate located in the buffer space and having a through hole, the through hole penetrating the base plate to provide the negative pressure in a region under the base plate to a region over the base plate in the inner space; a plurality of lift pins upwardly protruding from the base plate and supporting a bottom surface of the substrate; and a driver configured to lift/lower the base plate within the buffer space.

In an embodiment, the vacuum hole comprises a pin hole through which the lift pin moves upwardly and/or downwardly.

In an embodiment, the vacuum hole further comprises a through hole placed apart from the pin hole.

In an embodiment, the buffer space is formed in a shape corresponding to the base plate when viewed from above.

In an embodiment, the base plate comprises: a central part connected to the driver; and a plurality of bar-shaped body part radially extending from the central part, and wherein the lift pin and the through hole are formed at the body part.

In an embodiment, the lift pin assembly comprises: a bottom holder coupled with the base plate and fixing a bottom end of the lift pin; and a top holder engaged with a top of the bottom holder, and fixing the bottom holder and the lift pin.

In an embodiment, the bottom holder and the top holder are provided as a material that suppresses a generation of static electricity, and the lift pin is provided as an insulation material.

The inventive concept provides a support unit supporting a substrate. The support unit includes a support plate having an inner space therein and having a vacuum hole on a top surface thereon, the vacuum hole being in communication with the inner space and sucking the substrate placed on the top surface of the support plate; a lift pin assembly configured to transfer a substrate between an outside transfer unit and the support plate; and a decompression unit configured to apply a negative pressure to the inner space, the lift pin assembly comprises: a base plate located in the inner space and having a through hole, the through hole penetrating the base plate to provide the negative pressure in a region under the base plate to a region over the base plate in the inner space; a plurality of lift pins upwardly protruding from the base plate and supporting a bottom surface of the substrate; and a driver configured to lift/lower the base plate within the inner space.

In an embodiment, the vacuum hole comprises: a pin hole through which the lift pin moves upwardly and/or downwardly; and a through hole placed apart from the pin hole.

In an embodiment, the inner space is formed in a shape corresponding to the base plate when seen from above.

In an embodiment, wherein the base plate comprises: a central part connected to the driver; and a plurality of bar-shaped body part, each body part radially extending from the central part, and wherein the lift pin and the through hole are formed at the body part.

In an embodiment, the lift pin assembly comprises: a bottom holder coupled with the base plate and fixing a bottom end of the lift pin; and a top holder engaged with a top of the bottom holder, and fixing a bottom holder and the lift pin.

In an embodiment, the bottom holder and the top holder are provided in a material that suppresses a generation of static electricity, and the lift pin is provided in an insulation material.

According to an embodiment of the inventive concept, a substrate may be efficiently treated.

According to an embodiment of the inventive concept, a substrate may be stably fixed.

According to an embodiment of the inventive concept, a substrate may be stably lifted/lowered.

According to an embodiment of the inventive concept, it is possible to minimize a deformation of a lift pin assembly by a plasma.

The effects of the inventive concept are not limited to the above-described effects, and effects not mentioned will be clearly understood by those skilled in the art from the present specification and the accompanying drawings.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Hereinafter, an embodiment of the inventive concept will be described in detail referring to FIG. 1 to FIG. 9.

Figure 1:
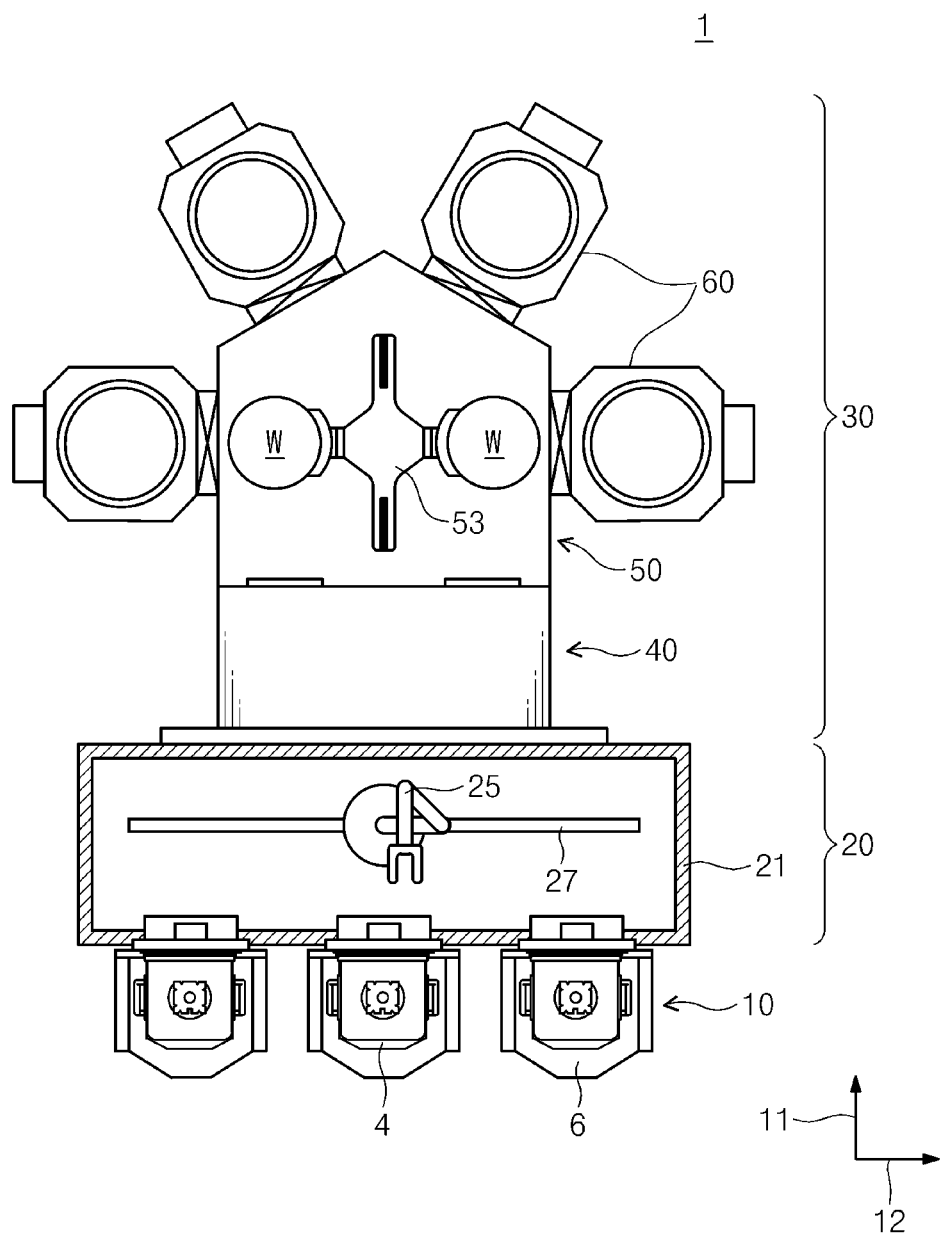
FIG. 1 is a view schematically illustrating an embodiment of a substrate treating apparatus according to an embodiment of the inventive concept.

FIG. 1 is a view schematically illustrating a substrate treating apparatus according to an embodiment of the inventive concept. Referring to FIG. 1, a substrate treating apparatus 1 has an equipment front end module (EFEM) 20 and a treating module 30. The equipment front end module 20 and the treating module 30 are disposed in a direction. Hereafter, the direction in which the equipment front end module 20 and the treating module 30 are arranged will be referred to as a first direction 11, and a direction that is perpendicular to the first direction 11 when viewed from above will be referred to as a second direction 12.

The equipment front end module 20 has a load port 10 and a transfer frame 21. The load port 10 is disposed in front of the equipment front end module 20. For example, the load port 10 and the equipment front end module 20 are disposed in the first direction 11. The load port 10 has a plurality of supports 6. The supports 6 are disposed along the second direction 12. At each of the supports 6, carriers 4 (for example, cassettes or FOUPs) storing a substrate W to be treated and a substrate W which has been treated is mounted. The substrate W to be treated and a substrate W which has been treated is stored at the carrier 4.

The transfer frame 21 is disposed between the load port 10 and the treating module 30. The transfer frame 21 includes a first transfer robot 25 disposed in the interior thereof and configured to transfer a substrate W between the load port 10 and the treating module 30. The first transfer robot 25 moves along a transfer rail 27 provided in the second direction 12 and transfers the substrate W between the carrier 4 and the treating module 30.

The treating module 30 includes a load lock chamber 40, a transfer chamber 50, and a process chamber 60. The treating module 30 may treat a substrate transferred from the equipment front end module 20.

The load lock chamber 40 is disposed adjacent to the transfer frame 21. As an example, the load lock chamber 40 may be disposed between the transfer chamber 50 and the equipment front end module 20. The load lock chamber 40 provides a space in which a substrate W, which is to be treated, stands by before the substrate W is transferred to the process chamber 60 or before the substrate W which has been treated is transferred to the equipment front end module 20.

The transfer chamber 50 transfers the substrate W. For example, the transfer chamber 50 may transfer the substrate W between the load lock chamber 40 and the process chamber 60. The transfer chamber 50 is disposed adjacent to the load lock chamber 40. The transfer chamber 50 may have a polygonal body when viewed from above. For example, the transfer chamber 50 may have a pentagonal body when viewed from above. The load lock chamber 40 and a plurality of process chambers 60 may be disposed along a circumference of the body outside the body. For example, as shown in FIG. 1, when the transfer chamber 50 has a pentagonal body, load lock chambers 40 may be disposed on sidewalls adjacent to the equipment front end module 20, and process chambers 60 may be continuously disposed at the other sidewalls. However, unlike the above description, a shape of the transfer chamber 50 is not limited thereto, and may be modified into various shapes according to a required process module.

A passage (not shown) through which the substrate W enters and exits may be formed on each sidewall of the body. The passage (not shown) connects the load lock chamber 40 to the transfer chamber 50 or the process chambers 60. A door (not shown) for opening and closing the passage (not shown) to seal an inside thereof is provided in each passage (not shown).

A second transfer robot 53 is operable as an outside transfer unit for transferring the substrate W between the load lock chamber 40 and the process chambers 60 is disposed in the inner space of the transfer chamber 50. The second transfer robot 53 transfers an untreated substrate W waiting in the load lock chamber 40 to the process chamber 60, or transfers a substrate W which has been treated in the process chamber 60 to the load lock chamber 40. In addition, the substrate W is transferred between the process chambers 60 to sequentially provide the substrate W to the plurality of process chambers 60.

The process chamber 60 may be disposed adjacent to the transfer chamber 50. The process chamber 60 may be disposed along a circumference of the transfer chamber 50. A plurality of process chambers 60 may be provided. In each process chamber 60, the treating process of the substrate W is performed. The process chamber 60 takes over the substrate W from the second transfer robot 53 to perform the treating process, and transfers the substrate Won which the treating process is completed to the second transfer robot 53. The treating process performed in each process chamber 60 may be different from each other.

Hereinafter, a process chamber 60 performing a plasma treating process among process chambers 60 will be described in detail. For example, the process chamber 60 for performing the plasma treating process may etch or ash a film material on the substrate W. The film material may be various types of films such as a polysilicon film, an oxide film, and a silicon nitride film. In some embodiments, the film material may be a natural oxide film or a chemically produced oxide film. In some embodiments, the film material may be a film made of a by-product generated during the treating process of the substrate W. In some embodiments, the film material may be a film made of an impurity attached and/or remaining on the substrate W.

In addition, a process chamber 60 configured to perform the plasma treating process on the edge region of the substrate W in the process chamber 60 of the substrate treating apparatus 1 described below will be described as an example. However, the inventive concept is not limited thereto, and the process chamber 60 of the substrate treating apparatus 1 described below may be applied equally or similarly to various process chambers 60 in which the substrate W is processed.

Figure 2:
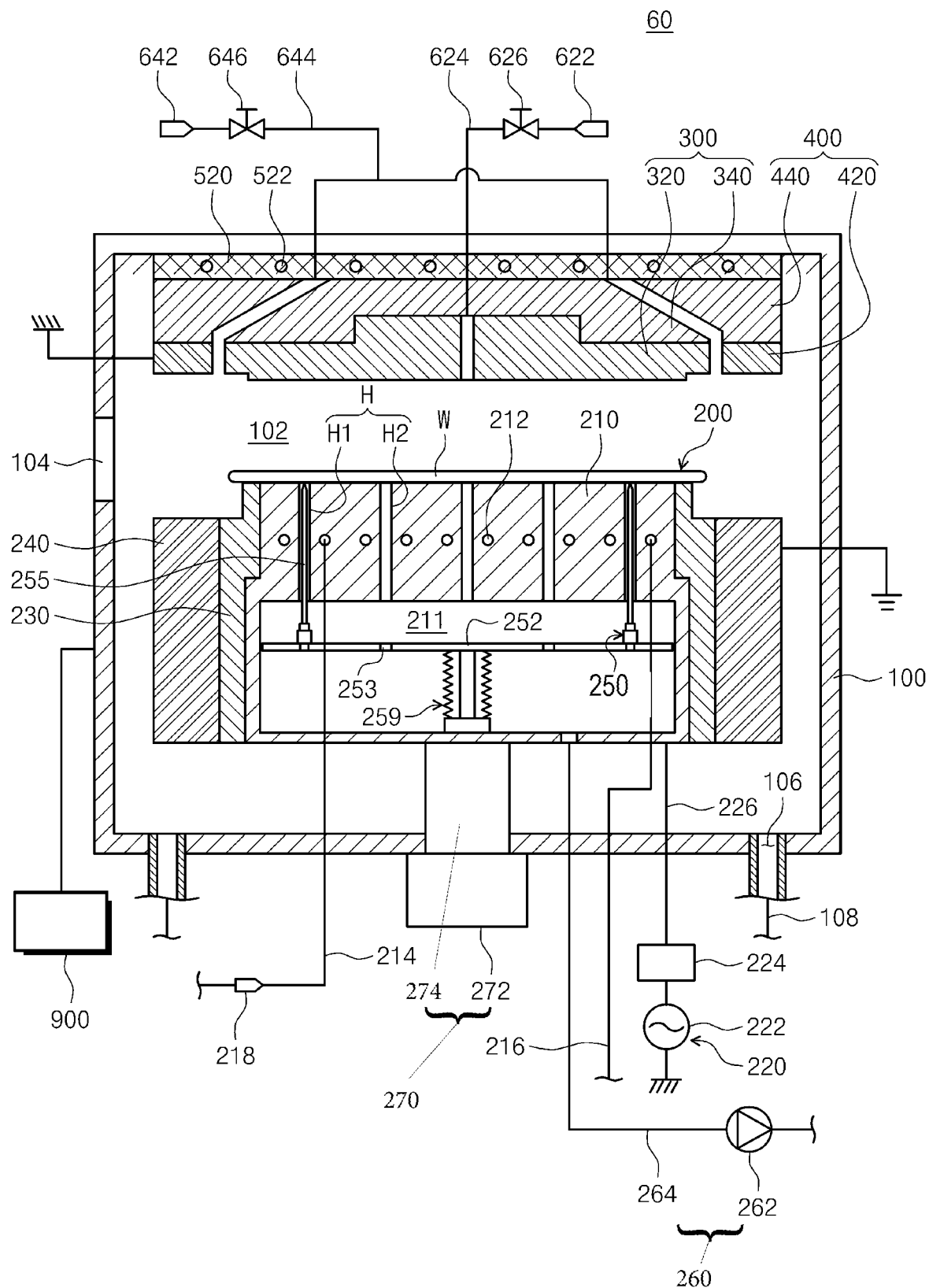
FIG. 2 is a view schematically illustrating an embodiment of the process chamber of FIG. 1 of the inventive concept.

FIG. 2 is a view schematically illustrating an embodiment of the process chamber of FIG. 1 of the inventive concept. Referring to FIG. 2, the process chamber 60 may perform the plasma treating process on the substrate W. For example, the process chamber 60 may supply a process gas and generate a plasma from the supplied process gas to treat the substrate W. The process chamber 60 may supply the process gas and generate the plasma from the supplied process gas to treat the edge region of the substrate W. Hereinafter, a bevel etching apparatus for performing the etching treatment on the edge region of the substrate Win the process chamber 60 according to an embodiment of the inventive concept will be described as an example.

The process chamber 60 may include a housing 100, a support unit 200, a dielectric plate unit 300, a top electrode unit 400, a temperature control unit 500, and a gas supply unit 600.

The housing 100 has a treating space 102 in which the substrate W is treated. An opening 104 may be formed at a sidewall of the housing 100. The substrate W may be taken into the treating space 102 inside the housing 100 through the opening 104 or may be taken out from the treating space 102. The opening 104 may be opened or closed by an opening/closing member such as a door (not shown). When the opening 104 is closed by the door (not shown), the treating space 102 may be isolated from the outside. In addition, an atmosphere of the treating space 102 may be formed at a low pressure close to a vacuum after being isolated from the outside.

The housing 100 may be made of a material including a metal. A surface of the housing 100 may be coated with an insulation material. The housing 100 may be grounded.

According to an embodiment, the housing 100 may be a vacuum chamber. For example, an exhaust hole 106 may be formed at the bottom surface of the housing 100. The plasma P generated in the treating space 102 and/or gases G1 and G2 supplied to the treating space 102 may be exhausted to an outside of the housing 100 through the exhaust hole 106. In addition, process by-products or the like generated in the process of treating the substrate W using the plasma P may be discharged to the outside of the housing 100 through the exhaust hole 106. The exhaust hole 106 may be connected to the exhaust line 108. The exhaust line 108 may be connected to a negative pressure member (not shown) providing negative pressure. The negative pressure member (not shown) may provide the negative pressure to the treating space 102 through the exhaust line 108 and the exhaust hole 106.

The support unit 200 supports the substrate W in the treating space 102. The support unit 200 may include a support plate 210, a power supply member 220, an insulation ring 230, a bottom edge electrode 240, a lift pin assembly 250, a decompression unit 260, and a driving member 270.

The support plate 210 supports the substrate W in the treating space 102. A support surface for supporting the substrate W may be formed on a top surface of the support plate 210. When viewed from above, the support plate 210 may have a substantially circular shape. According to an example, the support plate 210 may have a diameter relatively smaller than that of the substrate W when viewed from above. Accordingly, a central region of the substrate W supported by the support plate 210 may be mounted on a support surface of the support plate 210, and the edge region of the substrate W may not contact the support surface of the support plate 210.

An inner space 211 may be formed inside the support plate 210. The lift pin assembly 250 to be described later may be disposed in the inner space 211. A shape of the inner space 211 may be formed to correspond to the shape of the base plate 252 to be described later when viewed from above. In addition, a decompression unit 260 to be described later may be connected to the inner space 211.

A vacuum hole H may be formed in the support plate 210. The vacuum hole H functions as a passage through which the negative pressure applied from the decompression unit 260 to be described later is transmitted to the substrate W. In an embodiment, the vacuum hole H may transfer a negative pressure applied from the decompression unit 260 to a bottom surface of the substrate W to fixedly suck the substrate W to the support plate 210. The vacuum hole H may be formed to communicate with the inner space 211 from the top surface of the support plate 210. The vacuum hole H is formed not to overlap a cooling channel 212 to be described later and a heating device (not shown) located inside the support plate 210.

The vacuum hole H may include a pin hole H1 and a through hole H2. The pin hole H1 functions as a passage through which a lift pin 255 to be described later moves up and down. A diameter of the pin hole H1 may be provided larger than a diameter of the lift pin 255.

The through hole H2 functions as a passage through which the negative pressure applied to the inner space 211 is transmitted to the substrate W. The through hole H2 is formed at a position that does not overlap the pin hole H1. For example, when viewed from above, the through hole H2 may be disposed at a position spaced apart from the pin hole H1. Although FIG. 2 shows that the through hole H2 is formed closer to a center than the pin hole H1, the inventive concept is not limited thereto. The through hole H2 may be formed further to the center than the pin hole H1.

A heating device (not shown) may be provided within the support plate 210. The heating device (not shown) may heat the support plate 210. For example, the heating device may be a heater. According to an example, the heater may be formed in a coil shape inside the support plate 210. However, the inventive concept is not limited thereto, and the arrangement and shape of the heaters may be variously modified and provided.

A cooling channel 212 may be formed inside the support plate 210. The cooling channel 212 may cool the support plate 210. The cooling channel 212 may cool the support plate 210, thereby adjusting a temperature of the substrate W supported by the support plate 210. The cooling channel 212 may be connected to a fluid supply line 214 and a fluid discharge line 216. The fluid supply line 214 may be connected to the fluid supply source 218. The fluid supply source 218 may store a cooling fluid. In addition, the fluid supply source 218 may supply the cooling fluid to the fluid supply line 214. The cooling fluid stored and/or supplied by the fluid supply source 218 may be a cooling water. In some embodiments, the cooling fluid stored and/or supplied by the fluid supply source 218 may be a cooling gas. The fluid discharge line 216 may discharge the cooling fluid supplied to the cooling channel 212 to an outside of the housing 100.

A shape of the cooling channel 212 formed in the support plate 210 is not limited to the shape shown in FIG. 2, and may be modified into various shapes. In addition, a configuration of cooling the support plate 210 is not limited to supplying a cooling fluid, and may be provided in various configurations (e.g., a cooling plate) capable of cooling the support plate 210.

The power supply member 220 may supply a high frequency power to the support plate 210. The power supply member 220, the bottom edge electrode 240 to be described later, and the top edge electrode 420 to be described later may function as a plasma source that generates a plasma in the edge region of the substrate W by exciting a process gas. The power supply member 220 may supply an RF power to the support plate 210. The power member 220 may include a power source 222, a matching device 224, and a power line 226. The power source 222 may be bias power. In addition, the power source 222 may be an RF power. The power source 222 may be connected to the support plate 210 via the power line 226. The matcher 224 may be provided to the power line 226 to perform an impedance matching.

The insulation ring 230 may have a ring shape when viewed from above. The insulation ring 230 may be provided to surround an outer periphery of the support plate 210 when viewed from above. In an embodiment, the insulation ring 230 may be made of a material having insulating properties.

The bottom edge electrode 240 may function as a plasma source. For example, the bottom edge electrode 240 may be a plasma source that generates the plasma by exciting the process gas supplied to the edge region of the substrate W.

The bottom edge electrode 240 may be provided in a ring shape when viewed from above. The bottom edge electrode 240 may be provided to surround an outer periphery of the insulation ring 230 when viewed from above. The bottom edge electrode 240 may be grounded. According to an embodiment of the inventive concept, the bottom edge electrode 240 may be disposed below the edge region of the substrate W. When viewed from above, the bottom edge electrode 240 may be disposed in the edge region of the substrate W supported by the support plate 210. The edge area of the substrate W may be an area overlapping an outer circumference of the substrate W when viewed from above. In some embodiments, the edge area of the substrate W may be an area that does not overlap the outer circumference of the substrate W when viewed from above. The bottom edge electrode 240 may be disposed below the substrate W when viewed from the front.

Figure 3:
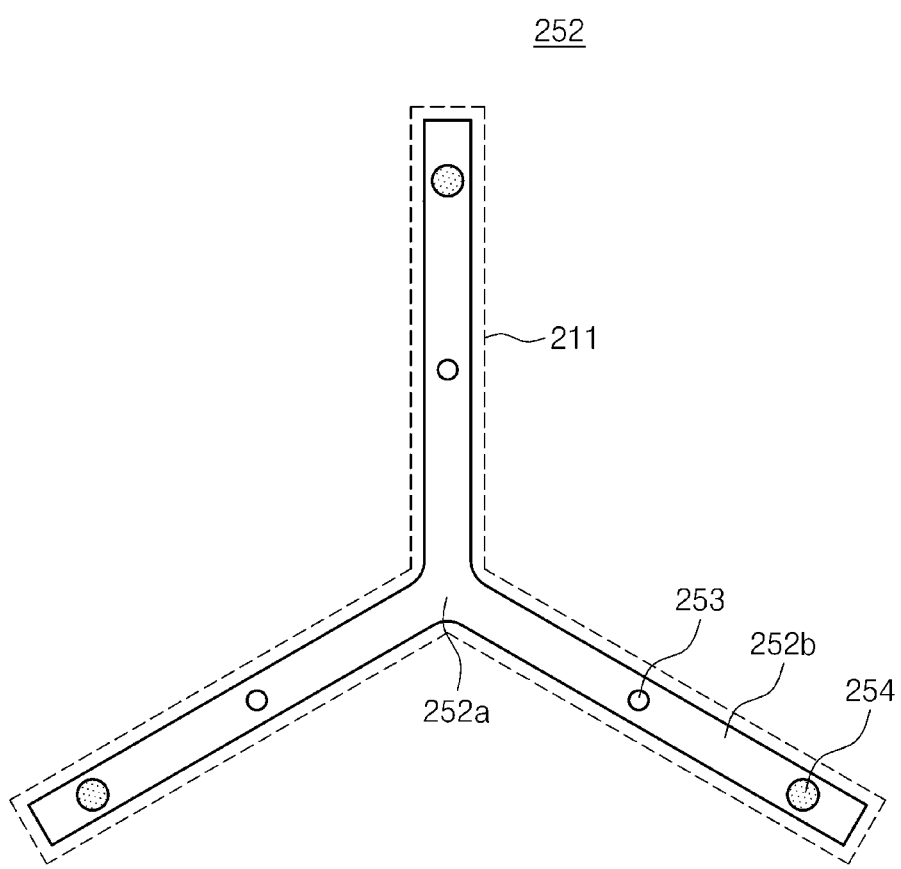
FIG. 3 is a view schematically illustrating a state in which a base plate of FIG. 2 is viewed from above.
Figure 4:
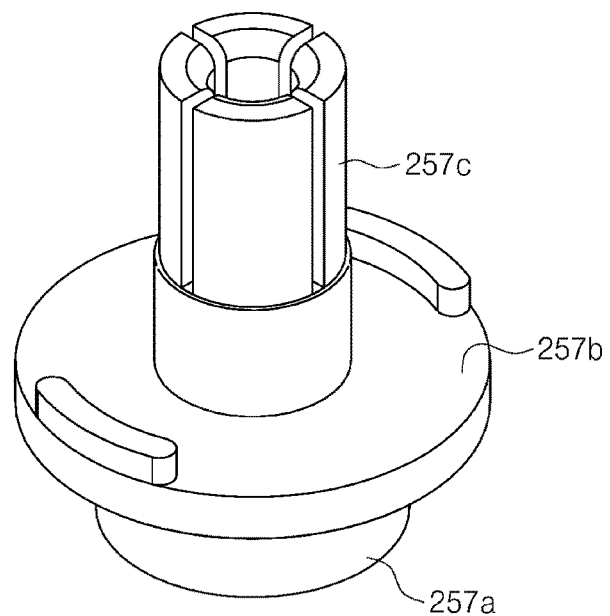
FIG. 4 and FIG. 5 are perspective views schematically showing a fixing member of FIG. 2.
Figure 5:
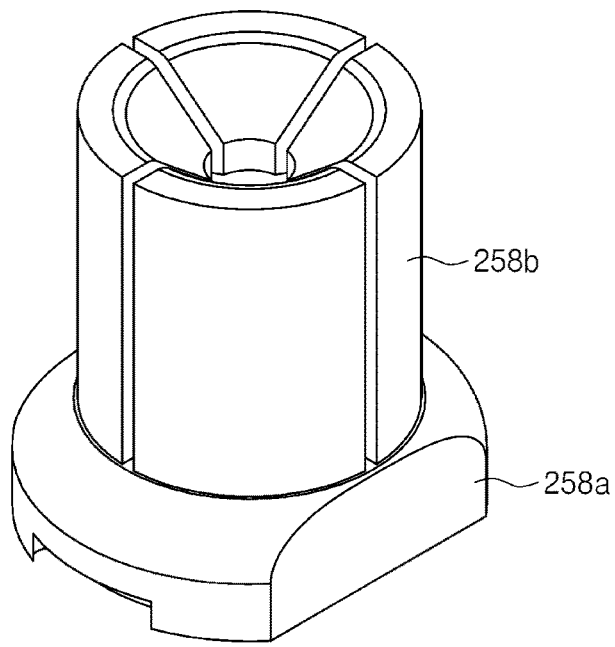
Figure 6:
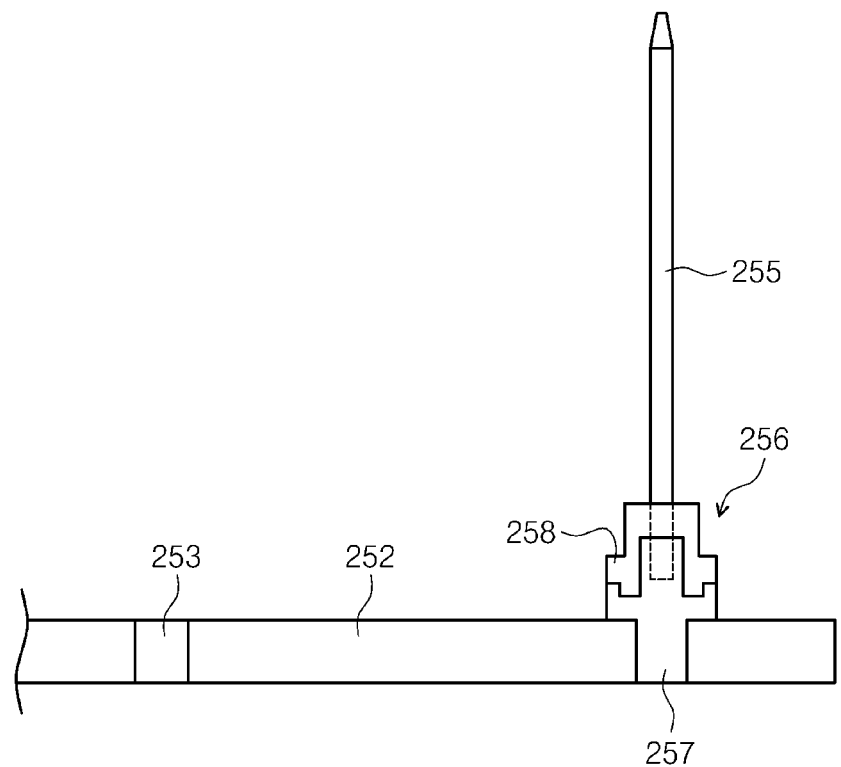
FIG. 6 is a view schematically showing a lift pin assembly of FIG. 2 when viewed from a front.

FIG. 3 is a view schematically illustrating a state in which a base plate of FIG. 2 is viewed from above. FIG. 4 and FIG. 5 are perspective views schematically showing a fixing member of FIG. 2. FIG. 6 is a view schematically showing the lift pin assembly of FIG. 2 when viewed from the front. Hereinafter, a lift pin assembly 250 according to an embodiment of the inventive concept will be described in detail with reference to FIG. 2 to FIG. 6.

The lift pin assembly 250 may lift/lower the substrate W. The lift pin assembly 250 may hand over the substrate W between the second transfer robot 53 and the support plate 210. The lift pin assembly 250 may be disposed in the inner space 211. The lift pin assembly 250 may include a base plate 252, a lift pin 255, a fixing member 256, and a driving member 259.

The base plate 252 may be located in the inner space 211. When viewed from above, the base plate 252 is formed in a shape corresponding to the inner space 211, e.g., the shape of the base plate 252 is substantially identical to the shape of the inner space 211 but with smaller size when viewed from above, thereby the base plate 252 may be located within the inner space 211 with spaced apart therefrom and move up/down therein. An outer circumferential surface of the base plate 252 may be provided to be spaced apart from an inner surface of the inner space 211. For example, the outer circumferential surface of the base plate 252 may be provided to be spaced apart from the inner surface of the inner space 211 to form a fine space. The base plate 252 may move in the inner space 211 in an up/down direction. For example, the base plate 252 may move in the up/down direction in the inner space 211 by the driving member 259 to be described later.

Referring to FIG. 3, the base plate 252 may include a central part 252a and a body part 252b. The central part 252a may be connected to the driving member 259 to be described later. The body part 252b may be provided in plural. The plurality of body part 252b may extend radially from the central part 252a and radially extending each body part 252b may define a bar shape. For example, three body parts 252b may be provided. The body part 252b may have the same length. In some embodiments, at least two body parts may have different length. Further, an angle between two adjacent body parts 252b may be constant. In some embodiment an angle between one pair of adjacent body parts 252b may be different another pair of adjacent body parts 252b.

A through hole 253 and a fastening hole 254 may be formed at the base plate 252. For example, each body part 252b may be provided with the through hole 253 and the fastening hole 254. The through hole 253 and the fastening hole 254 are spaced apart from each other. The through hole 253 may penetrate from a top end to a bottom end of the body part 252b, thus communicate with the inner space 211. The through hole 253 functions as a passage through which a negative pressure applied to the inner space 211 moves. The through hole 253 may provide a negative pressure provided in a region under the base plate 252 to a region over the base plate 252 in the inner space 211 in which a negative pressure is provided by the decompression unit 260 to be described later.

The fastening hole 254 may penetrate from the top end to the bottom end of the body part 252b. The lift pin 255 to be described later is fastened to the fastening hole 254. For example, a bottom holder 257 to be described later may be fastened to the fastening hole 254. In the above-described embodiment, the fastening hole 254 formed penetrating the body part 252b vertically is used as an example, but the inventive concept is not limited thereto. For example, the fastening hole 254 may be provided as a groove formed by being indented a preset distance downward from the top end of the body part 252b without vertically penetrating thorough the body part 252b.

The lift pin 255 supports the bottom surface of the substrate W. The lift pin 255 is formed to upwardly protrude from the base plate 252. A plurality of lift pins 255 may be provided. In an embodiment, three lift pins 255 may be provided. As many lift pins 255 may be provide as bod parts 252b. Each lift pin 255 may be coupled to the respective body part 252b. The lift pin 255 may be fixedly coupled to the bottom holder 257 and a top holder 258 to be described later and coupled to the base plate 252. The plurality of lift pins 255 may share a center of the central part 252a and may be disposed to have a same radius. The lift pin 255 may move along the pin hole H1 formed in the support plate 210 in the up/down direction. The lift pin 255 may be made of an insulation material.

Referring to FIG. 4 to FIG. 6, the fixing member 256 couples the base plate 252 and the lift pin 255 to each other. The fixing member 256 is made of an elastic material. In an embodiment, the fixing member 256 may be formed of a material including a plastic resin-based polyether ether ketone (PEEK). In addition, the fixing member 256 may be made of a conductive material. In an embodiment, the fixing member 256 may be formed of a conductive material having a range of 0 to $10^5$ Ω/cm2. In addition, the fixing member 256 may be made of a static dissipation material. In an embodiment, the fixing member 256 may be formed of an electrostatic dissipation material having a range of $10^6$ to $10^9$ Ω/cm2. In addition, the fixing member 256 may be made of an anti-static material. In an embodiment, the fixing member 256 may be formed of an antistatic material having a range of $10^{10}$ to $10^{13}$ Ω/cm2.

The fixing member 256 may include a bottom holder 257 and a top holder 258. The bottom holder 257 may be coupled to the base plate 252, thereby fixing a bottom end of the lift pin 255. The bottom holder 257 may include a base plate coupling part 257a, a bottom coupling part 257b, and a first fixing part 257c.

The base plate coupling part 257a, the bottom coupling part 257b, and the first fixing part 257c may be integrally formed. The base plate coupling part 257a may be coupled to the fastening hole 254. The base plate coupling part 257a is coupled to the fastening hole 254, and the fixing member 256 is fixedly coupled to the base plate 252.

The bottom coupling part 257b is located above the base plate coupling part 257a. When the bottom holder 257 is fixed to the base plate 252, the bottom surface of the bottom coupling part 257b may be in surface contact with the top surface of the base plate 252. Accordingly, the bottom holder 257 may be supported from the base plate 252 by the bottom coupling part 257b. The bottom coupling part 257b may be engaged to a top coupling part 258a to be described later. As the bottom coupling part 257b and the top coupling part 258a are engaged to each other, the bottom holder 257 and the top holder 258 may be fixedly coupled to each other.

The first fixing part 257c is located above the bottom coupling part 257b. The first fixing part 257c is formed to protrude from the bottom coupling part 257b. The first fixing part 257c fixes and supports the bottom end of the lift pin 255. The first fixing part 257c is formed to surround an outer circumferential surface of the lift pin 255. In an embodiment, the first fixing part 257c may be formed in a cylindrical shape having a hollow. By inserting the lift pin 255 into the hollow of the first fixing part 257c, the first fixing part 257c may fix the lift pin 255.

The top holder 258 is coupled to the bottom holder 257 and the lift pin 255. The top holder 258 may be coupled to the bottom holder 257 and may fix further the lift pin 255. The top holder 258 may include a top coupling part 258a and a second fixing part 258b. The top coupling part 258a and the second fixing part 258b may be integrally formed.

The top coupling part 258a may be fastened to the bottom coupling part 257b. When the top coupling part 258a and the bottom coupling part 257b are coupled to each other, the top coupling part 258a is located above the bottom coupling part 257b. Accordingly, the top holder 258 may be fixedly coupled to the bottom holder 257.

The second fixing part 258b is located above the top coupling part 258a. The second fixing part 258b is formed to protrude from the top coupling part 258a. The second fixing part 258b fixes the lift pin 255. The second fixing part 258b fixes and supports a top part of a bottom end of the lift pin 255 supported by the first fixing part 257c. In an embodiment, the second fixing part 258b may be formed to surround the first fixing part 257c and surround the lift pin 255 upwardly protruding from the first fixing part 257c. Accordingly, the second fixing part 258b may provide a fixing force to each of the first fixing part 257c and the lift pin 255. Accordingly, while fixing the bottom holder 257, the top holder 258 may provide a binding force to the lift pin 255.

The driving member 259 provides a driving force to the base plate 252. The driving member 259 may move vertically (upwardly and downwardly) the base plate 252 within the inner space 211. The driving member 259 may move the base plate 252 from a top end to a bottom end of the inner space 211. In addition, the driving member 259 may move the base plate 252 from the bottom end to the top end of the inner space 211.

The driving member 259 may be located in the inner space 211. However, the inventive concept is not limited thereto, and the driving member 259 may be located outside the support unit 200. In an embodiment, the driving member 259 may be provided as a motor. However, the inventive concept is not limited thereto, and the driving member 259 may be transformed into various devices that provide a known driving force. In addition, a bellows providing a restoring force may be installed at the driving member 259.

Referring back to FIG. 2, the decompression unit 260 applies a negative pressure to the inner space 211. The decompression unit 260 provides the negative pressure to the substrate W. The decompression unit 260 may include a decompression pump 262 and a decompression line 264. The decompression pump 262 applies the negative pressure to the decompression line 264. The decompression pump 262 may be a pump that provides the negative pressure. However, the inventive concept is not limited thereto, and the decompression pump 262 may be variously modified into a known device that provides the negative pressure. An end of the decompression line 264 may be connected to the decompression pump 262, and the other end of the decompression line 264 may be connected to the inner space 211. For example, the other end of the decompression line 264 may be connected to a bottom surface of the inner space 211.

The lifting/lowering member 270 may lift/lower the support plate 210. The lifting/lowering member 270 may include a driver 272 and a shaft 274. The driver 272 may lift/lower the support plate 210 in the up/down direction through the shaft 274. The shaft 274 may be coupled to the support plate 210. In addition, the shaft 274 may be connected to the driver 272. As the driving member 270 lifts/lowers the support plate 210, an interval between a top surface of the substrate W supported by the support plate 210 and a bottom surface of the dielectric plate 320 to be described later may be adjusted.

Figure 7:
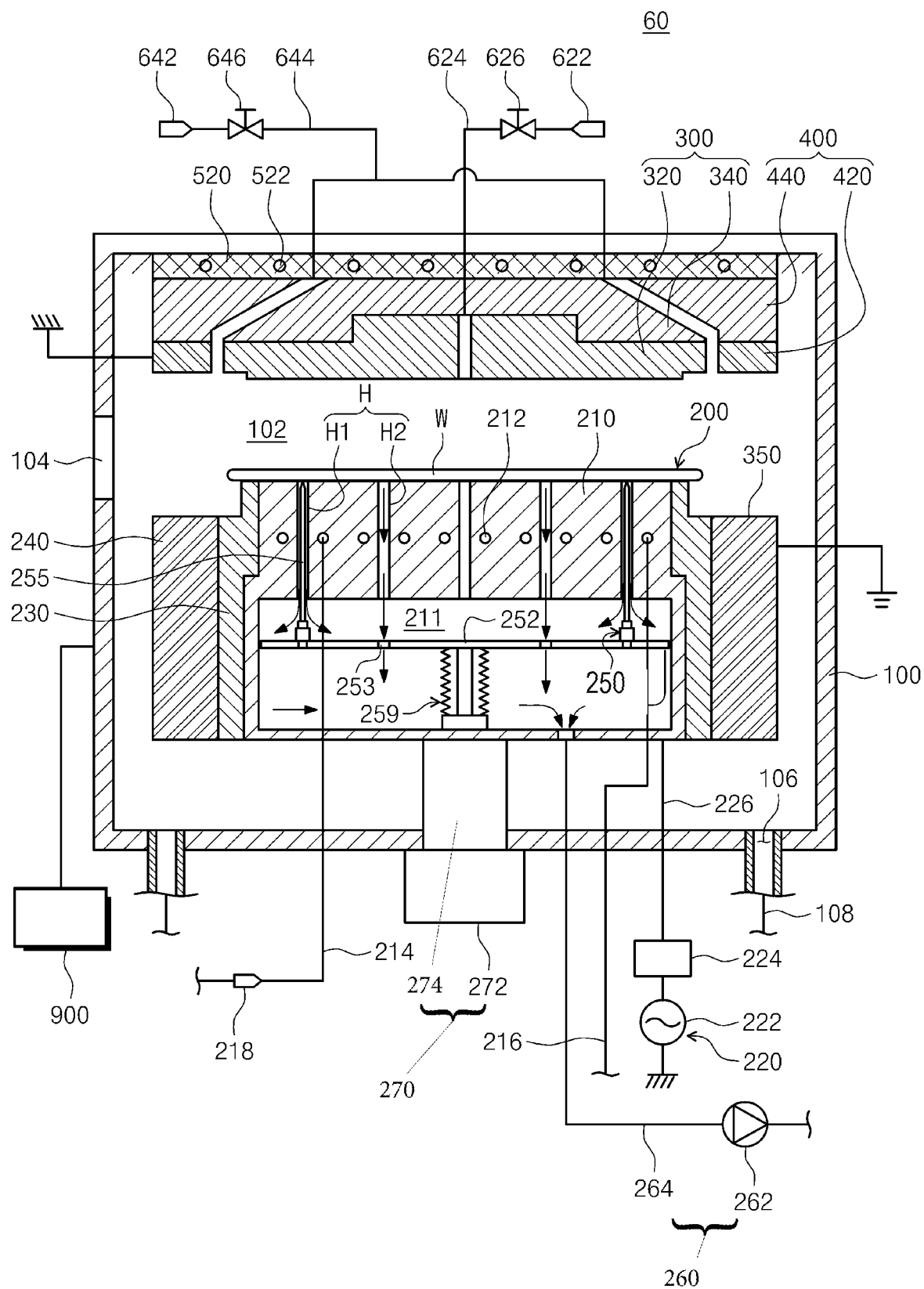
FIG. 7 is a view schematically illustrating a state in which a decompression unit of FIG. 2 applies a negative pressure to an inner space.
Figure 8:
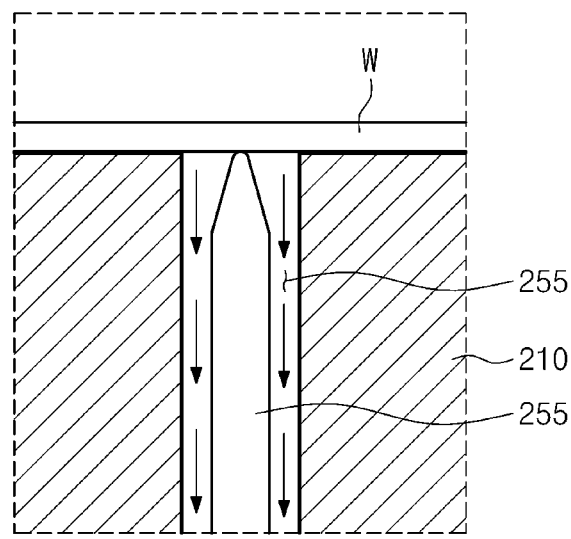
FIG. 8 is a view schematically illustrating an enlarged view of a pin hole when the decompression unit of FIG. 7 applies a negative pressure to an inner space.

FIG. 7 is a view schematically illustrating a state in which the decompression unit of FIG. 2 applies the negative pressure to an inner space. FIG. 8 is a view schematically illustrating an enlarged view of a pin hole when the decompression unit of FIG. 7 applies the negative pressure to an inner space. Hereinafter, a mechanism by which negative pressure sucking and fixing the substrate in the support unit according to an embodiment of the inventive concept flows will be described in detail with reference to FIG. 7 and FIG. 8.

The lift pin assembly 250 receives the substrate W from the second transfer robot 53 and transfers the substrate W to the support plate 210. In this case, the lift pin 255 may stably move up and down by the fixing member 256.

Specifically, the bottom holder 257 is stably coupled to the base plate 252 that moves up/down, and at the same time fixedly support the bottom end of the lift pin, a coupling stability of the lift pin 255 is ensured by the up/down movement of the base plate 252. In addition, the top holder 258 fixes the bottom holder 257 coupled to the base plate 252 and simultaneously fixes and supports the lift pin 255 again, thereby preventing a shaking of the lift pin 255 due to the up/down movement of the base plate 252. Accordingly, by improving a coupling stability of the lift pin assembly 250, it is possible to minimize a generation of a vibration on the substrate W supported by the lift pin 255. Accordingly, since the substrate W is stably supported by the support plate 210 and thereby maintaining a horizontal state, a plasma treatment may be smoothly performed on an edge region of the substrate W to be described later.

In addition, as shown in FIG. 7 and FIG. 8, when the substrate W is appropriately seated on the support plate 210 by the lift pin 255, the substrate W is vacuum-sucked at the top surface of the support plate 210 by the decompression unit 260. For example, the decompression unit 260 provides the negative pressure to a bottom region of the inner space 211. The negative pressure applied to the bottom region of the inner space 211 is transferred to the top region of the inner space 211 through the through hole 253 formed in the base plate 252. The negative pressure transferred to the top region of the inner space 211 reaches the bottom surface of the substrate W along the pin hole H1 and the through hole H2. The negative pressure applied to the bottom surface of the substrate W allows the substrate W to be stably sucked and fixed to the support plate 210.

When the substrate W is not properly fixed to the support plate 210 and thus horizontally shakes, it is difficult to process the substrate W properly. Particularly, as will be described later, when the plasma treatment is performed by targeting the edge region of the substrate W, the substrate W must be supported at a correct process position. In an embodiment, when the horizontality required by the process position of the substrate W on the support plate 210 is broken, the plasma treatment on the edge region of the substrate W cannot be uniformly performed.

Accordingly, according to an embodiment of the inventive concept, the coupling stability of the lift pin assembly 250 may be improved to stably lift/lower the substrate W. In addition, by providing a stable negative pressure to the substrate W through the through hole 253 formed at the base plate 252 and the pin hole H1 and the through hole H2 formed at the support plate 210, the substrate W is stably sucked at the top surface of the support plate 210 to maintain the appropriate process position.

Also, as described later, in accordance with an embodiment of the inventive concept, since the plasma P is formed at the edge region of the substrate W, electrical characteristics exist on the substrate W. Accordingly, if the lift pin 255 in contact with the substrate W is electrically connected, arcing may occur in the lift pin 255. Accordingly, according to an embodiment of the inventive concept, the lift pin 255 is formed of an insulation material, thereby minimizing the risk of arcing the lift pin assembly 250.

In addition, since the fixing member 256 that couples the lift pin 255 and the base plate 252 is made of an elastically deformable material, the lift pin 255 may be stably supported within an elastic range of the fixing member 256. In addition, as the fixing member 256 is provided with a material that suppresses a generation of static electricity (e.g., a conductive material, an electrostatic dissipation material, or an antistatic material), an effect of grounding static electricity through the fixing member 256 may be obtained when electric charges are present around the lift pin 255. Accordingly, a structural stability and a durability of the lift pin assembly 250 may be increased.

Referring back to FIG. 2, the dielectric plate unit 300 may include a dielectric plate 320 and a first base 340. The dielectric plate 320 may be disposed such that a bottom surface thereof faces the top surface of the support plate 210. When viewed from above, the dielectric plate 320 may have a substantially circular shape. A top surface of the dielectric plate 320 may be formed to be stepped so that a height of the central region is relatively higher than a height of the edge region. The bottom surface of the dielectric plate 320 may be formed in a generally flat shape. Among the bottom surfaces of the dielectric plate 320, an edge region may be formed to be stepped so that a height thereof is relatively higher than that of a central region. Among the bottom surfaces of the dielectric plate 320, a plasma P to be described later may enter the stepped region. Accordingly, an efficiency of processing the edge region of the substrate W may be improved.

The dielectric plate 320 is located in the treating space 102. The dielectric plate 320 is disposed above the support unit 200. The dielectric plate 320 is disposed to face the top surface of the substrate W supported by the support unit 200 in the treating space 102. In an embodiment, the dielectric plate 320 may be disposed to face the top surface of the substrate W supported by the support plate 210 in the treating space 102.

The dielectric plate 320 may be made of a material including a ceramic. A gas channel connected to a first gas supply unit 620 of a gas supply unit 600 to be described later may be formed at the dielectric plate 320. A discharge end of the gas channel may be configured such that a first gas G1 supplied by the first gas supply unit 620 is supplied to the central region of the substrate W supported by the support unit 200. For example, the discharge end of the gas channel may be configured to supply the first gas G1 to a top surface of the central region of the substrate W supported by the support unit 200.

The first base 340 may be disposed between the dielectric plate 320 and a temperature control plate 520 to be described later. The first base 340 may be coupled to the temperature control plate 520, and the dielectric plate 320 may be coupled to the first base 340. Accordingly, the dielectric plate 320 may be coupled to the temperature control plate 520 via the first base 340.

A diameter of the first base 340 may gradually increase from top to bottom. A diameter of a top surface of the first base 340 may be smaller than a diameter of the bottom surface of the dielectric plate 320. The top surface of the first base 340 may have a flat shape. A bottom surface of the first base 340 may have a stepped shape. For example, a bottom surface of an edge region of the first base 340 may be formed to be stepped so that a height at the edge region thereof is lower than that of the central region.

The bottom surface of the first base 340 and the top surface of the dielectric plate 320 may have a shape that may be combined with each other. For example, a central region of the dielectric plate 320 may be inserted into a central region of the first base 340. The first base 340 may be made of a material including a metal. In an embodiment, the first base 340 may be made of a material including an aluminum. A position of the dielectric plate 320 may be fixed by the first base 340.

The top electrode unit 400 may function as a plasma source. For example, the top electrode unit 400 may be a plasma source that generates a plasma by exciting a process gas supplied to an edge region of the substrate W. The top electrode unit 400 may include a top edge electrode 420 and a second base 440.

The top edge electrode 420 may be grounded. The top edge electrode 420 may have a shape surrounding the dielectric plate 320 when viewed from above. The top edge electrode 420 may have a ring shape when viewed from above. The top edge electrode 420 may be provided to be spaced apart from the dielectric plate 320. The top edge electrode 420 may be spaced apart from the dielectric plate 320 to form a separation space. The separation space may form some of the channels through which a second gas G2 supplied by a second gas supply unit 640 to be described later flows.

A discharge end of the gas channel may be configured to supply the second gas G2 to the edge region of the substrate W supported by the support unit 200. For example, the discharge end of the gas channel may be configured to supply the second gas G2 to a top surface of the edge region of the substrate W supported by the support unit 200.

The top edge electrode 420 may be grounded. According to an embodiment of the inventive concept, the top edge electrode 420 may be disposed on the edge region of the substrate W. When viewed from above, the top edge electrode 420 may be disposed in the edge region of the substrate W supported by the support plate 210. The edge area of the substrate W may be an area overlapping the outer circumference of the substrate W when viewed from above. Selectively, the edge area of the substrate W may be an area that does not overlap the outer circumference of the substrate W when viewed from above. The top edge electrode 420 may be disposed above the substrate W when viewed from the front.

The second base 440 may be disposed above the support plate 210. The second base 440 may be disposed above the substrate W supported by the support plate 210. The second base 440 may fix a position of the top edge electrode 420. The second base 440 may be disposed between the top edge electrode 420 and the temperature control plate 520 to be described later. The second base 440 may be coupled to the temperature control plate 520, and the top edge electrode 420 may be coupled to the second base 440. Accordingly, the top edge electrode 420 may be coupled to the temperature control plate 520 via the second base 440.

The second base 440 may have a ring shape when viewed from above. The top and bottom surface of the second base 440 may be formed in a flat shape. When viewed from above, the second base 440 may have a shape surrounding the first base 340. An inner diameter of the second base 440 may gradually increase from top to bottom. The second base 440 may be provided to be spaced apart from the first base 340. The second base 440 may be spaced apart from the first base 340 to form a separation space. The separation space may form a part of a gas channel through which a second gas G2 supplied by the second gas supply unit 640 to be described later flows. The second base 440 may be made of a material including a metal. In an embodiment, the second base 440 may be made of a material including an aluminum.

The temperature control unit 500 may include a temperature control plate 520 and a fluid supply module (not shown). The fluid supply module (not shown) may supply and discharge the cooling fluid to the channel 522 formed in the temperature control plate 520.

The temperature control plate 520 may be coupled to the dielectric plate unit 300 and the top electrode unit 400, respectively. The temperature control plate 520 is located within the housing 100. The temperature control plate 520 may be installed at a ceiling of the housing 100. The temperature control plate 520 prevents temperatures of the first base 340 and the second base 440 from being excessively increased. A channel 522 through which the cooling fluid CF flows may be formed in the temperature control plate 520. The cooling fluid CF may be a cooling water. Selectively, the cooling fluid CF may be a cooling gas.

According to an embodiment of the inventive concept, the first base 340 is disposed between the dielectric plate 320 and the temperature control plate 520. The first base 340 may be made of a material different from that of the dielectric plate 320, and may be made of the same material as that of the temperature control plate 520. That is, a thermal expansion rate of the first base 340 may be relatively closer to a thermal expansion rate of the temperature control plate 520 than a thermal expansion rate of the dielectric plate 320. Accordingly, by disposing the first base 340 between the dielectric plate 320 and the temperature control plate 520, it is possible to minimize an occurrence of distortion between the temperature control plate 520 and the dielectric plate 320 due to a cold heat generated by the temperature control plate 520. This is because the first base 340 in direct contact with the temperature control plate 520 is made of a material similar to that of the temperature control plate 520.

Similar to the above description, according to an embodiment of the inventive concept, the second base 440 is disposed between the top edge electrode 420 and the temperature control plate 520. The second base 440 may be made of a material different from that of the top edge electrode 420, and may be made of a same material as or similar to the temperature control plate 520. That is, a thermal expansion rate of the second base 440 may be relatively closer to the thermal expansion rate of the temperature control plate 520 than the thermal expansion rate of the top edge electrode 420. Accordingly, since the second base 440 is disposed between the top edge electrode 420 and the temperature control plate 520, it is possible to minimize an occurrence of distortion between the temperature control plate 520 and the top edge electrode 420 due to the cold heat generated by the temperature control plate 520. This is because the second base 440 in direct contact with the temperature control plate 520 is made of a material similar to that of the temperature control plate 520.

The gas supply unit 600 supplies a gas to the treating space 102. The gas supply unit 600 may supply the first gas G1 and the second gas G2 to the treating space 102. The gas supply unit 600 may include a first gas supply unit 620 and a second gas supply unit 640.

The first gas supply unit 620 supplies the first gas G1 to the treating space 102. The first gas G1 may be an inert gas such as nitrogen. The first gas supply unit 620 may supply the first gas G1 to the central region of the substrate W supported by the support plate 210. The first gas supply unit 620 may include a first gas supply source 622, a first gas supply line 624, and a first valve 626.

The first gas supply source 622 may store the first gas G1. In addition, the first gas supply source 622 may supply the first gas G1 to the first gas supply line 624. The first gas supply line 624 may be connected to a channel formed at the dielectric plate 320. A first valve 626 may be installed at the first gas supply line 624. The first valve 626 may be provided as an on/off valve. Selectively, the first valve 626 may be provided as a flow control valve. The first gas G1 supplied by the first gas supply source 622 may be supplied to a central region of the top surface of the substrate W through a channel formed at the dielectric plate 320.

The second gas supply unit 640 supplies the second gas G2 to the treating space 102. The second gas G2 may be a process gas excited in a plasma state. The second gas supply unit 640 may supply the second gas G2 to the edge region of the substrate W through a gas channel formed by the dielectric plate 320, the first base 340, the top edge electrode 420, and the second base 440 spaced apart from each other. The second gas supply unit 640 may include a second gas supply source 642, a second gas supply line 644, and a second valve 646.

The second gas supply source 642 may store the second gas G2. In addition, the second gas supply source 642 may supply the second gas G2 to the second gas supply line 644. The second gas supply line 644 may supply the second gas G2 to a separation space functioning as a gas channel. The second valve 646 may be installed at the second gas supply line 644. The second valve 646 may be an on/off valve. Selectively, the second valve 646 may be provided as a flow control valve. The second gas G2 supplied by the second gas supply source 642 may be supplied to the top edge region of the substrate W through a gas channel.

A controller 900 may control the substrate treating apparatus 1. The controller 900 may control the substrate treating apparatus 1 to perform a plasma treating process performed below. For example, the controller 900 may control the support unit 200, the temperature control plate 520, and the gas supply unit 600. For example, when a gas is supplied from the first gas supply unit 620 and/or the second gas supply unit 640, the controller 900 may control the support unit 200 and the gas supply unit 600 to apply a power to the support unit from the power 222 to generate a plasma P in an edge region of the substrate W supported by the support plate 210.

The controller may include a process controller formed of a microprocessor (computer) that executes the control of the substrate treating apparatus 1000, a user interface formed of a keyboard in which an operator performs a command input operation or the like in order to manage the substrate treating apparatus 1000, a display for visualizing and displaying an operation situation of the substrate treating apparatus 1000, and the like, and a storage unit storing a control program for executing the process executed in the substrate treating apparatus 1000 under the control of the process controller or a program, that is, a treatment recipe, for executing the process in each component according to various data and treating conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

Figure 9:
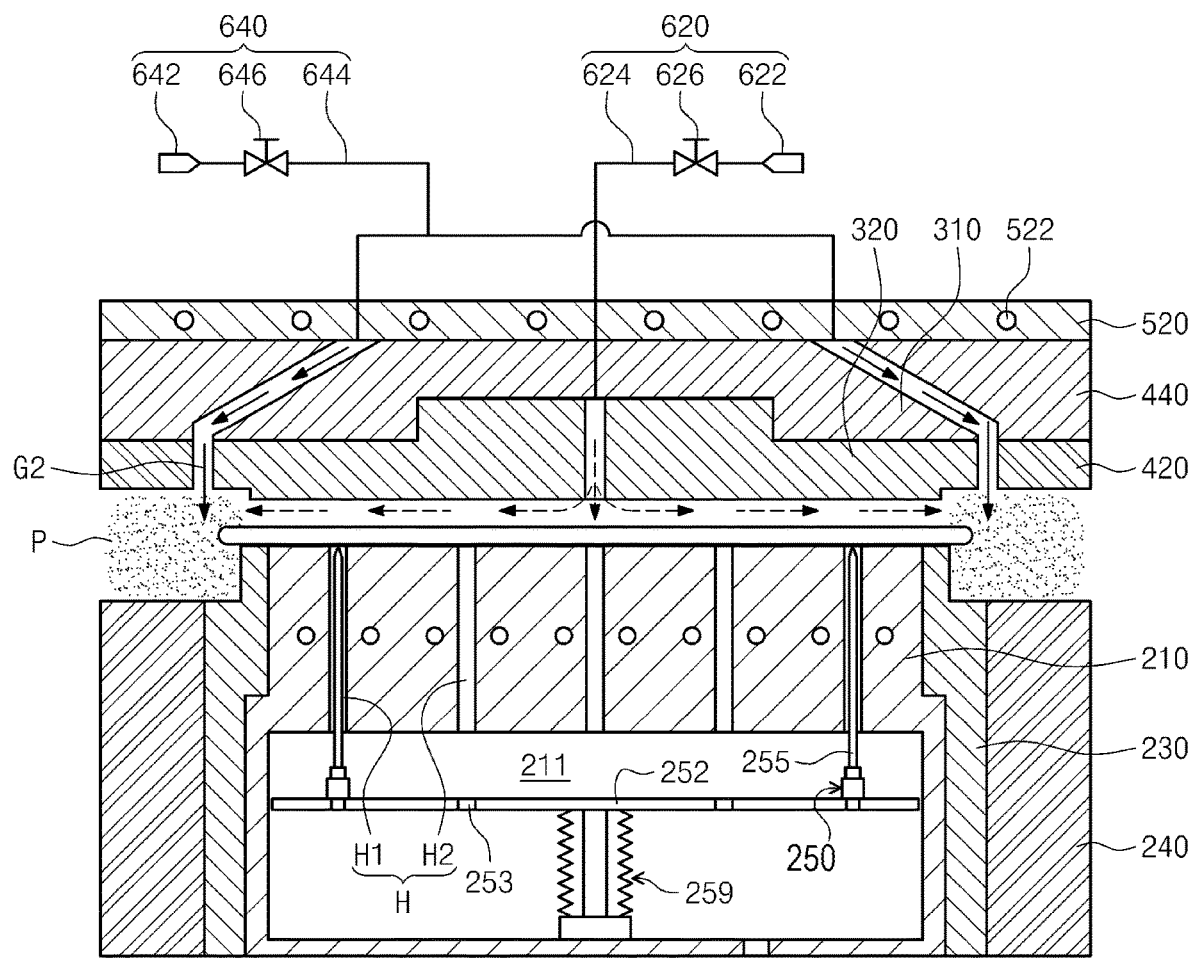
FIG. 9 is a view schematically illustrating an embodiment of performing a plasma treating process in the process chamber of FIG. 2.

FIG. 9 is a view schematically illustrating an embodiment of performing the plasma treating process in the process chamber of FIG. 2. Referring to FIG. 9, the substrate treating apparatus 1 according to an embodiment of the inventive concept may treat the edge region of the substrate W. For example, the substrate treating apparatus 1 may generate the plasma P in the edge region of the substrate W to treat the edge region of the substrate W. For example, the substrate treating apparatus 1 may perform a bevel etch process for treating the edge region of the substrate W.

In order to perform the bevel etch process on the substrate W, the lift pin assembly 250 receives the substrate W from the second transfer robot 53 and transfers the substrate W to the support plate 210. In order to perform the bevel etch process on the substrate W, the lifting/lowering member 270 may move the support unit 200 upward to narrow the gap between the substrate W and the dielectric plate 320.

When the substrate treating apparatus 1 treats the edge region of the substrate W, the first gas supply unit 620 may supply the first gas G1 to the central region of the substrate W, and the second gas supply unit 640 may supply the second gas G2 to the edge region of the substrate W. Since the second gas G2 supplied by the second gas supply unit 640 is a process gas, it may be excited in a plasma P state to treat the edge region of the substrate W. For example, a thin film on the edge region of the substrate W may be etched by the plasma P. In addition, the first gas G1 supplied to the central region of the substrate W is an inert gas, and the first gas G1 prevents the second gas G2 from flowing into the central region of the substrate W, thereby further increasing a treating efficiency for the edge region of the substrate W.

In the above-described embodiment of the inventive concept, the support unit 200 moves in the up/down direction and the positions of the dielectric plate 320 and the top edge electrode 420 are fixed, but the inventive concept is not limited thereto. For example, the position of the support unit 200 may be fixed, and the dielectric plate 320 may be configured to be movable in the up/down direction. In addition, both the support unit 200 and the dielectric plate 320 may be configured to be movable in the up/down direction.

In addition, in the above-described embodiment of the inventive concept, the bottom edge electrode 240 and the top edge electrode 420 are respectively grounded as examples, but the inventive concept is not limited thereto. One of the bottom edge electrode 240 and the top edge electrode 420 may be grounded, and the other may be connected to an RF power source. In addition, both the bottom edge electrode 240 and the top edge electrode 420 may be connected to the RF power source.

The method of generating the plasma P by the substrate treating apparatus 1 described in the above example may be an inductive coupled plasma (ICP) method. In addition, the above-described method of generating the plasma P by the substrate treating apparatus 1 may be a capacitor couple plasma (CCP) method. In addition, the substrate treating apparatus 1 may use both the ICP (Inductive Couple Plasma) method and the CCP (Capacitor Couple Plasma) method, or generate the plasma P using a selected method among the ICP (Inductive Couple Plasma) method or the CCP (Capacitor Couple Plasma) method. In addition, the substrate treating apparatus 1 may generate the plasma P using a remote plasma method.

The above detailed description illustrates the inventive concept. Also, the above-described description is to illustrate and describe a preferred embodiment of the inventive concept, and the inventive concept may be used in various other combinations, changes, and environments. That is, changes or modifications may be made within the scope of the concept of the invention disclosed in this specification, the scope equivalent to the disclosed content, and/or the skill or knowledge of the art. The above-described embodiment is to describe the best state for implementing the technical idea of this invention, and various changes required in the specific application fields and uses of this invention are also possible. Accordingly, the detailed description of the inventive concept is not intended to limit the inventive concept to the disclosed embodiment. In addition, the scope of the attached claim should be interpreted as including other implementations.

The invention claimed is:

1. A substrate treating apparatus comprising:
 a housing having a treating space;
 a support unit configured to support a substrate and disposed within the treating space;
 a dielectric plate disposed over the support unit and opposing a top surface of the substrate supported by the support unit;
 a gas supply unit configured to supply a process gas to an edge region of the substrate; and
 a plasma source configured to generate a plasma by exciting the process gas at the edge region of the substrate;
 wherein the plasma source comprises:
  a top edge electrode disposed above the edge region of the substrate supported by the support unit; and
  a bottom edge electrode disposed below the edge region of the substrate supported by the support unit;
 the support unit comprising:
  a support plate having an inner space therein, the support plate comprising a plurality of vacuum holes on a top surface thereon and in communication with the inner space;
  a lift pin assembly configured to transfer the substrate between an outside transfer unit and the support plate; and
  a decompression unit configured to apply a negative pressure to the inner space;
  wherein the plurality of vacuum holes is configured to allow transfer of the negative pressure applied from the decompression unit to a bottom surface of the substrate to fixedly suck the substrate to the support plate;
 the lift pin assembly comprising:
  a base plate located in the inner space, the base plate comprising a through hole penetrating the base plate to provide the negative pressure in a region under the base plate to a region over the base plate in the inner space;

a plurality of lift pins upwardly protruding from the base plate and supporting a bottom surface of the substrate; and a driver configured to lift/lower the base plate within the inner space;

wherein the base plate comprises:

a central part connected to the driver; and a plurality of bar-shaped body parts, each of the plurality of body parts radially extending from the central part;

wherein the plurality of lift pins and the through hole are formed at the plurality of body parts.

2. The substrate treating apparatus of claim 1, wherein the plurality of vacuum holes comprises a plurality of pin holes through which the plurality of lift pins is movable upwardly and/or downwardly.

3. The substrate treating apparatus of claim 2, wherein the plurality of vacuum holes further comprises a penetration hole spaced apart from the plurality of pin holes.

4. The substrate treating apparatus of claim 1, wherein the inner space is formed in a shape corresponding to the base plate when seen from above.

5. The substrate treating apparatus of claim 1, wherein the lift pin assembly comprises:

a bottom holder coupled with the base plate and fixing a bottom end of one of the plurality of lift pins; and a top holder engaged with a top of the bottom holder and fixing the bottom holder and the one of the plurality of lift pins.

6. The substrate treating apparatus of claim 5, wherein the bottom holder and the top holder comprise an elastic material.

7. The substrate treating apparatus of claim 5, wherein the bottom holder and the top holder comprise a conductive material.

8. The substrate treating apparatus of claim 5, wherein the bottom holder and the top holder comprise an electrostatic dissipation material.

9. The substrate treating apparatus of claim 5, wherein the bottom holder and the top holder comprise an antistatic material.

10. The substrate treating apparatus of claim 1, wherein each of the plurality of lift pins is provided in an insulation material.

11. A substrate treating apparatus comprising:

a housing having a treating space;

a support unit configured to support a substrate and disposed within the housing;

a gas supply unit configured to supply a process gas to the treating space; and a plasma source configured to generate a plasma from the process gas;

wherein the support unit comprises:

a support plate having an inner space therein, the support plate comprising a plurality of vacuum holes on a top surface thereon and in communication with the inner space;

a lift pin assembly configured to transfer the substrate between an outside transfer unit and the support plate; and a decompression unit configured to apply a negative pressure to the buffer inner space; and wherein the plurality of vacuum holes is configured to allow transfer of the negative pressure applied from the decompression unit to a bottom surface of the substrate to fixedly suck the substrate to the support plate;

the lift pin assembly comprising:

a base plate located in the inner space, the base plate comprising a through hole penetrating the base plate to provide the negative pressure in a region under the base plate to a region over the base plate in the inner space;

a plurality of lift pins upwardly protruding from the base plate and supporting a bottom surface of the substrate; and a driver configured to lift/lower the base plate within the inner space;

wherein the base plate comprises:

a central part connected to the driver; and a plurality of bar-shaped body parts radially extending from the central part; and wherein the plurality of lift pins and the through hole are formed at the plurality of body parts.

12. The substrate treating apparatus of claim 11, wherein the plurality of vacuum holes comprises a plurality of pin holes through which the plurality of lift pins is movable upwardly and/or downwardly.

13. The substrate treating apparatus of claim 12, wherein the plurality of vacuum holes further comprises a through hole placed apart from the plurality of pin holes.

14. The substrate treating apparatus of claim 11, wherein the inner space is formed in a shape corresponding to the base plate when viewed from above.

15. The substrate treating apparatus of claim 11, wherein the lift pin assembly comprises:

a bottom holder coupled with the base plate and fixing a bottom end of one of the plurality of lift pins; and a top holder engaged with a top of the bottom holder, and fixing the bottom holder and the one of the plurality of lift pins.

16. The substrate treating apparatus of claim 15, wherein the bottom holder and the top holder comprise a material that suppresses a generation of static electricity, and wherein each of the plurality of lift pins is provided in an insulation material.

17. A support unit supporting a substrate, the support unit comprising:

a support plate having an inner space therein, the support plate comprising a plurality of vacuum holes on a top surface thereon and in communication with the inner space;

a lift pin assembly configured to transfer a substrate between an outside transfer unit and the support plate; and a decompression unit configured to apply a negative pressure to the inner space;

wherein the plurality of vacuum holes is configured to allow transfer of the negative pressure applied from the decompression unit to a bottom surface of the substrate to fixedly suck the substrate to the support plate;

the lift pin assembly comprising:

a base plate located in the inner space, the base plate comprising a through hole penetrating the base plate to provide the negative pressure in a region under the base plate to a region over the base plate in the inner space;

a plurality of lift pins upwardly protruding from the base plate and supporting a bottom surface of the substrate; and a driver configured to lift/lower the base plate within the inner space;

wherein the base plate comprises:

a central part connected to the driver; and a plurality of bar-shaped body part, each of the plurality of body parts radially extending from the central part; and wherein the plurality of lift pins and the through hole are formed at the plurality of body parts.

18. The support unit of claim 17, wherein the inner space is formed in a shape corresponding to the base plate when seen from above, and wherein the plurality of vacuum holes comprises:
  a plurality of pin holes through which the plurality of lift pins is movable upwardly and/or downwardly; and
  a through hole placed apart from the plurality of pin holes; and wherein the lift pin assembly comprises:
  a bottom holder coupled with the base plate and fixing a bottom end of one of the plurality of lift pins; and
  a top holder engaged with a top of the bottom holder, and fixing a bottom holder and the one of the plurality of lift pins; and wherein the bottom holder and the top holder comprise a material that suppresses a generation of static electricity; and wherein each of the plurality of lift pins is provided in an insulation material.

* * * * *